US012695003B2

(12) United States Patent
Lu et al.

(10) Patent No.: US 12,695,003 B2
(45) Date of Patent: Jul. 28, 2026

(54) METAL GRID FLEXIBLE TRANSPARENT CONDUCTIVE FILM AND ITS PREPARATION METHOD AND APPLICATIONS

(71) Applicant: City University of Hong Kong Shenzhen Futian Research Institute, Shenzhen (CN)

(72) Inventors: Jian Lu, Shenzhen (CN); Xufen Xiao, Shenzhen (CN); Yu Bu, Shenzhen (CN); Pengfei Liu, Shenzhen (CN)

(73) Assignee: City University of Hong Kong Shenzhen Futian Research Institute, Shenzhen (CN)

( * ) Notice: Subject to any disclaimer, the term of this patent is extended or adjusted under 35 U.S.C. 154(b) by 170 days.

(21) Appl. No.: 18/609,388

(22) Filed: Mar. 19, 2024

(65) Prior Publication Data

US 2025/0118454 A1      Apr. 10, 2025

(30) Foreign Application Priority Data

Oct. 8, 2023    (CN) .......................... 202311298814.3

(51) Int. Cl.
| | |
|---|---|
| *B32B 3/10* | (2006.01) |
| *B32B 3/14* | (2006.01) |
| *B32B 3/16* | (2006.01) |
| *C23C 14/04* | (2006.01) |
| *C23C 14/20* | (2006.01) |
| *C23C 14/35* | (2006.01) |
| *H01B 1/02* | (2006.01) |
| *H01B 5/14* | (2006.01) |

(52) U.S. Cl.
CPC .................. *H01B 5/14* (2013.01); *B32B 3/10* (2013.01); *B32B 3/14* (2013.01); *B32B 3/16* (2013.01); *C23C 14/042* (2013.01); *C23C 14/205* (2013.01); *C23C 14/35* (2013.01); *H01B 1/02* (2013.01)

(58) Field of Classification Search
CPC .... B32B 3/10; B32B 3/14; B32B 3/16; B32B 15/20; C23C 14/35; C23C 14/042
See application file for complete search history.

(56) References Cited

U.S. PATENT DOCUMENTS

2018/0105921 A1* 4/2018 Cui ...................... G02B 5/3058

OTHER PUBLICATIONS

CN 108257731 (Year: 2020).*
CN 109493997 (Year: 2021).*

* cited by examiner

*Primary Examiner* — Elizabeth E Mulvaney
(74) *Attorney, Agent, or Firm* — NKL Law; Allen Xue

(57) ABSTRACT

A metal grid flexible transparent conductive film and its preparation method and applications are provided. The conductive film has a flexible substrate and a sputtered metal grid, the metal grid forming various desired patterns on the flexible substrate. Magnetron sputtering method is used to accurately control the thickness of the metal grid layer by controlling the deposition time, so as to prepare a flexible transparent conductive film with good quality, high transmittance, high conductivity and strong bending resistance. The conductive film can be used as a flexible transparent electrode material with excellent properties, and can satisfy the demand of flexible display screen or flexible electronics, and the preparation process is simple, safe and non-toxic, and it can be convenient to prepare a large-area metal grid.

12 Claims, 3 Drawing Sheets

METAL GRID FLEXIBLE TRANSPARENT CONDUCTIVE FILM AND ITS PREPARATION METHOD AND APPLICATIONS

CROSS-REFERENCE TO RELATED APPLICATION

The present application claims the priority of the prior application No. CN 202311298814.3 submitted to China National Intellectual Property Administration on Oct. 8, 2023, which is entitled "Metal grid flexible transparent conductive film and its preparation method and applications", the content of which is incorporated herein by reference in its entirety.

TECHNICAL FIELD

The present disclosure belongs to the technical field of metal films, and particularly concerns Metal grid flexible transparent conductive film and its preparation method and applications.

BACKGROUND

Transparent electrodes (TEs) play a key role in many modern devices, including solar cells, light-emitting diodes, touch screens, wearable electronics and transparent heaters. The field of transparent electrodes has long been dominated by transparent conducting oxides (TCOs). In the early 1950s, a wide bandgap semiconductor material with high optical transparency was reported, such as $SnO_2$ and $In_2O_3$, which could be doped with impurities to enhance their conductivity. After more than 60 years of extensive research, indium tin oxide (ITO) films have emerged as a representative transparent electrode material with excellent optical and electronic properties and have been widely used commercially. However, in recent years, there has been an increasing demand for flexibility, stretchability and foldability of flexible electronic devices. ITO is not only limited in production by the severe shortage of indium resources, but also has poor mechanical flexibility itself and is prone to cracking during strain or bending. Although there are ITO/PET substrates on the market that can be applied to flexible optoelectronic devices, due to the brittleness of ITO, the bending strain tolerance and cyclic fatigue resistance of ITO on flexible substrates are insufficient, which makes it difficult to get practical application of flexible ITO/PET substrates in stretchable, foldable or bendable optoelectronic devices.

As a result, the search for new materials with higher performance and additional properties has become one of the hottest research topics today. New materials need to have better flexibility and stability, more abundant and available raw materials and lower processing costs. Based on this goal, a number of emerging transparent conductive materials have emerged as alternatives to traditional ITO, It consists of three main types of materials: i) carbon nanomaterials, such as carbon nanotubes (CNTs) or graphene; ii) conductive polymers (e.g., PEDOT:PSS); and iii) metallic nanomaterials, such as metallic nanofilms, metallic nanowire grid, and metallic grid, etc. These materials have been extensively studied and have been shown to have high potential in overcoming the drawbacks of ITO. Among all the emerging materials to replace ITO, metallic nanomaterials show higher optical and electrical properties than carbon nanomaterials (e.g., graphene or carbon nanotubes, etc.). In addition, metal nanomaterials have received a lot of attention due to their significant additional advantages such as good mechanical properties such as flexibility and tensile properties, low cost, ease of fabrication, flexibility and wide applicability.

In metallic grid nanomaterials, the commonly used method for preparing metallic grids are currently based on photolithographic techniques, such as optical lithography and nanoimprint lithography. Photolithography allows precise control of the grid pattern, but optical lithography has a large linewidth, making it susceptible to Moray interference problems. This limitation restricts its application in products such as high-resolution smartphones and tablets. Another type of nanoimprint lithography, although capable of reducing the linewidth, requires the simultaneous use of techniques such as electron beam etching or focused ion beam etching, or the use of electron beam evaporation, however, these additional steps increases the preparation time and cost.

There are other methods of preparing metallic grid such as templated electrodeposition and imprinted transfer processes. High-performance metal-mesh transparent electrodes with excellent surface smoothness can be obtained by embedding metallic grid into polymers. However, such processes typically involve complex multiple transfer and stripping steps, which can lead to reduced cost-effectiveness in large-scale manufacturing, and there may be issues with process repeatability and uniformity.

With the declining utilization of ITO in the transparent electrode market, preparation techniques for metallic grid and other ITO alternatives are expected to continue growing. Metallic grids can exhibit better optical-electrical properties than ITO films due to the highly tunable nature of their microstructure, and can achieve an optimal balance between optical and electrical properties compared to other metallic materials, such as ultra-thin metal films, which can be individually optimized for optical transmittance and electrical conductivity.

However, metal grids still face some challenges: 1) the relative trade-off between transparency and conductivity still needs to be solved in a simpler way during the preparation process; and 2) preparation processes still need to be improved, including cost reduction and enhanced pattern accuracy. Therefore, addressing these challenges and improving the comprehensive performance of flexible transparent conductive films with metal grids to expand their applications has become a hot issue in current research.

SUMMARY

In order to solve the above problem, the present disclosure provides a metal grid flexible transparent conductive film and its preparation method and applications, the conductive film in this disclosure exhibits optimal transparency and conductivity, making it particularly suitable for use in stretchable, foldable or bendable optoelectronic devices.

Specifically, the present disclosure provides the following technical solution:

A metallic grid flexible transparent conductive film comprising a flexible substrate and a sputtered metal grid. The metallic grid forms various desired patterns on the flexible substrate.

In one embodiment of the present disclosure, the flexible substrate is selected from a flexible PET substrate, a CPI substrate, or a flexible ultra-thin glass. The PET substrate has a high visible light transmittance and high bending resistance, and is a transparent electrode substrate material with excellent performance.

In one embodiment of the present disclosure, the metallic grid is a metal Ag grid. It has been found that metal Ag has a high conductivity and can be used to prepare electrodes with very low sheet resistance, and its high ductility makes it suitable for preparing high-performance flexible lattice electrodes.

In one embodiment of the present disclosure, the metallic grid forms different lattice patterns on the flexible substrate such as metallic square grid, metallic triangular grid, metallic brick wall shaped grid, metallic honeycomb grid, metallic circular grid and so on. The different geometrical shapes of the metallic grids can be an important factor in modulating the conductivity-transparency balance.

In one embodiment of the present disclosure, the thickness of the metallic grid is 50 nm to 600 nm. Exemplarily, it may be 50 nm, 60 nm, 70 nm, 80 nm, 90 nm, 100 nm, 150 nm, 200 nm, 250 nm, 300 nm, 350 nm, 400 nm, 500 nm or 600 nm.

In one embodiment of the present disclosure, the metal line width of the metallic grid is 1 μm to 50 μm, preferably 5 μm to 30 μm.

Exemplarily, 1 μm, 5 μm, 10 μm, 15 μm, 20 μm, 25 μm, 30 μm, 35 μm, 40 μm, 45 μm or 50 μm.

In one embodiment of the present disclosure, the size area of the metallic grid ranges from 2 cm×2 cm to 20 cm×20 cm.

In one embodiment of the present disclosure, the metallic grid flexible transparent conductive films has a sheet resistance of 4 to 10 $\Omega sq^{-1}$.

In one embodiment of the present disclosure, the metallic grid has a light transmittance of 90 or more at 550 nm, specifically, it can be 92% or more, and further specifically, it can be 93.5% or more.

In one embodiment of the present disclosure, the overall light transmittance of the metal grid flexible transparent conductive film at 550 nm reaches more than 80%, specifically, it can reach more than 82%.

According to another aspect of the present disclosure, there is also provided a method of preparing a flexible transparent conductive film with metallic lattice, comprising the steps of:

S1, preparing a polymer template, cutting a desired hollow stripe pattern in the center of the polymer template;

S2, preparing a flexible substrate, fastening it to a substrate to form a flexible substrate/baseboard combination, and fixing the polymer template prepared in step S1 to the flexible substrate to form a template/substrate/baseboard combination;

S3, placing the template/substrate/baseboard combination into a magnetron sputtering coating device, passing rare gas under vacuum conditions, adjusting the power, sputtering a metal target onto the flexible substrate by magnetron sputtering method for deposition, removing the template, and obtaining the metallic grid flexible and transparent conductive film.

In one embodiment of the present disclosure, a laser is used in the step S1 to cut a desired hollow stripe pattern in the center of the polymer template.

In one embodiment of the present disclosure, the parameters of the laser cutting are adjusted to obtain polymer templates with different pattern, the cutting parameters include cutting energy, cutting spacing and cutting length.

In one embodiment of the present disclosure, the cutting energy is 8 to 20 W, the cutting pitch is 100 to 500 μm, and the cutting length is 2 to 20 cm.

In one embodiment of the present disclosure, the step S2 include the followings: Cleaning the flexible substrate with acetone and ethanol solution with a volume ratio of 1:1, and then cleaning in deionized water, and dried with nitrogen, Finally, the polymer template was fixed on the flexible substrate with high-temperature tape.

In one embodiment of the present disclosure, in the step S3, the template is faced with the Ag target, the vacuum is pumped to $10^{-5}$-$10^{-9}$ torr, the target is bombarded by the magnetron sputtering gas Ar with a power of 300-500 w, and the deposition time is 30-900 s, preferably 90 s-600 s.

Exemplarily, 30 s, 60 s, 90 s, 120 s, 180 s, 240 s, 300 s, 360 s, 420 s, 480 s, 540 s, 600 s or 900 s.

Preferably, the partial pressure of Ar is controlled at 60% to 70%.

In one embodiment of the present disclosure, the polymer template is a polyimide sheet; the polymer template has an overall size of 4 cm×4 cm-24 cm×24 cm and a thickness of 30-90 μm.

In one embodiment of the present disclosure, the metal target is at least one of Ag target, Cu target, Al target, Au target.

In one embodiment of the present disclosure, the pattern of polymer template is a parallel hollow stripe pattern, and the conductive film with a square, triangular, or crossed metallic grid pattern is obtained by coating 2, 3, or 4 times, respectively, in the step S3.

According to another aspect of the present disclosure, the application of metal grid flexible transparent conductive film in a flexible display or a flexible electronic device is also provided.

Specifically, it can be used for cell phone screens.

The present disclosure optimizes and achieves the optimal transparency and electrical conductivity by the followings: designing and preparing the templates required for magnetron sputtering, adjusting the cutting parameters to obtain templates with different internal patterns; selecting the appropriate substrate and sputtering parameters, and the thickness of the metal grid layer can be precisely tuned (e.g., controlled from 50 nm to 600 nm) by controlling the time of sputtering and coating.

Beneficial Effects of the Present Disclosure

1) The present disclosure employs magnetron sputtering to prepare a flexible transparent conductive film comprising a flexible substrate (PET) and a metal grid, and the magnetron sputtering method can accurately control the microscopic pattern of the metal grid as well as the thickness of the film, so as to optimize the conductivity, the light transmittance and the mechanical properties of the flexible transparent conductive film. Specifically, the shape of the microscopic pattern of the metal grid, such as square, triangle, etc., as well as the dimensions of the microscopic pattern of the metal grid, such as line width and size, can be accurately controlled by the effective cooperation of the template design (e.g., designed as hollow parallel stripes) and the magnetron sputtering method.

For example, the light transmittance of a square metal grid (removing the effect of the substrate) can be approximated to be approximately given by the percentage of space between the metal lines, which can be quantified by the following equation: light transmittance=(grid spacing−line width)$^2$/grid spacing$^2$, and can be easily adjusted by modifying the geometrical parameters (line widths and line spacing) of the grid microstructure.

In addition to being related to line width and line spacing, electrical conductivity is also related to the height of the metal lines (that is, the thickness of the metal grid). Therefore, the balance between electrical conductivity and light transmittance can be easily optimized by adjusting the line width, line spacing and thickness of the metal grid. The conductivity can be characterized by the sheet resistance, sheet resistance=(resistivity*grid spacing)/(line height*line width).

2) The present disclosure adjusts the line width and line spacing of the metal grid by adjusting the width and spacing of the hollow parallel stripes on the template, adjusts the thickness of the metal grid by adjusting the magnetron sputtering time, and gets different shapes and patterns by adjusting the number of times of magnetron sputtering, so as to prepare metal grids with different geometrical parameters, and obtains high-quality flexible and transparent films of metal grids with high light transmittance, high electrical conductivity, and strong bending resistance. The preparation process is simple, safe and non-toxic, and films of various sizes can also be prepared as required. In addition, the template of the present disclosure can be prepared by laser cutting and can be reused, which is simple, efficient and low cost.

3) The flexible transparent conductive film prepared by the present disclosure has a sheet resistance of 4 to 10 $\Omega sq^{-1}$, which means strong electrical conductivity, and the light transmittance of the metal grid is more than 90% (e.g., the light transmittance of the Ag square grid is more than 93% at 550 nm); the substrate material is a flexible substrate, and the prepared flexible transparent conductive film is able to reach a higher than 100,000 times of bending and can also maintain a higher conductive stability and visible light transmittance, which can be used as a flexible transparent electrode material with excellent properties, and has extremely high application prospects in the fields of flexible displays or flexible electronic devices, such as mobile phone screens.

BRIEF DESCRIPTION OF THE ATTACHED DRAWINGS

DETAILED DESCRIPTION

In order to make the objects, technical solutions and advantages of the present disclosure clearer and more understandable, the present disclosure is described in further detail below in conjunction with the accompanying drawings and embodiments. It should be emphasized that the specific embodiments described herein are only for better elaboration of the present disclosure, and are partial embodiments of the present disclosure, not all embodiments, and therefore are not used to limit the present disclosure. In addition, the technical features involved in the embodiments of the present disclosure described below may be combined with each other as long as they do not constitute a conflict with each other.

In the present disclosure, the light transmittance (also known as transmittance) is tested with a UV spectrometer; the sheet resistance is tested with a four-point probes resistivity tester.

Implementation Example 1

(1) Preparation of PI template: laser cutting polyimide (PI) (overall size of 20 cm×20 cm, thickness of 70 μm) into a template with a parallel hollow stripe pattern in the center with a cutting energy of 15 W, a cutting line spacing of 300 μm, and a length of the cutting stripes of 16 cm. The prepared template was sequentially immersed in deionized water, ethanol for cleaning, and blow-dried with nitrogen gas.

(2) Prepare the template/substrate/glass plate combination: clean the PET substrate sequentially with a mixture of acetone and ethanol (Volume ratio 1:1) and deionized water, and then blow dry with nitrogen. The cleaned flexible substrate is tightly taped to the glass plate to form a flexible substrate/glass plate combination.

(3) Taped the PI template prepared in step (1) on the PET substrate after the substrate/glass plate combination of step (2) with high temperature tape to obtain the PI/PET/glass plate combination. After that it was placed in the magnetron sputtering chamber, make the PI face the Ag target (the purity of the Ag target was 99.99%), and the vacuum of the sputtering system was pumped to $10^{-5}$-$10^{-9}$ torr in the magnetron sputtering coating system. The target material is bombarded by sputtering Ar gas through a magnetron sputtering coating machine. The purity of the argon gas is 99.9% and the sputtering power is 300 W.

Figure 1:
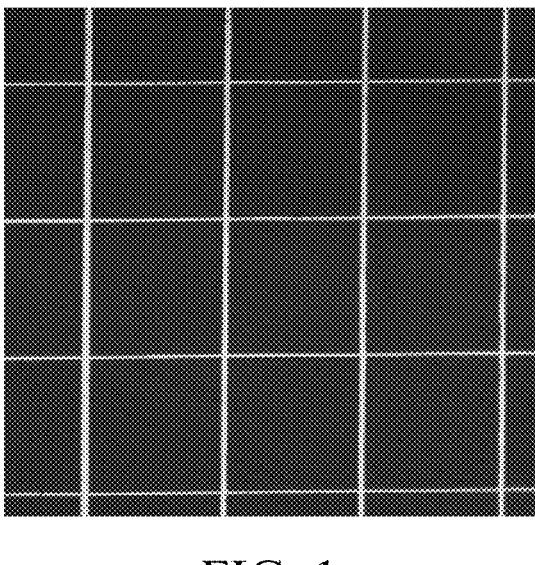
FIG. 1 shows an optical microscope photograph of the surface of the Ag square grid flexible transparent PET film of Example 1.

(4) Take out the PI/PET/glass plate combination of step (3), rotate the PI template by 90° and fix it on the PET substrate again, and put it into the magnetron sputtering chamber for sputtering again with the same sputtering parameters as above, and finally a flexible transparent conductive PET film coated with Ag square grid was obtained as shown in FIG. 1.

In this case, the Ag metal grid has a thickness of about 150 nm, a light transmittance of 93.5% (wavelength at 550 nm), and a sheet resistance of 8.4 $\Omega sq^{-1}$.

Implementation Example 2

The preparation method is the same as in Example 1, with the difference that in step (4), the coating process is increased from 2 times to 3 times, and the microscopic pattern of the prepared product is changed from a square metal grid to a triangular metal grid.

Figure 2:
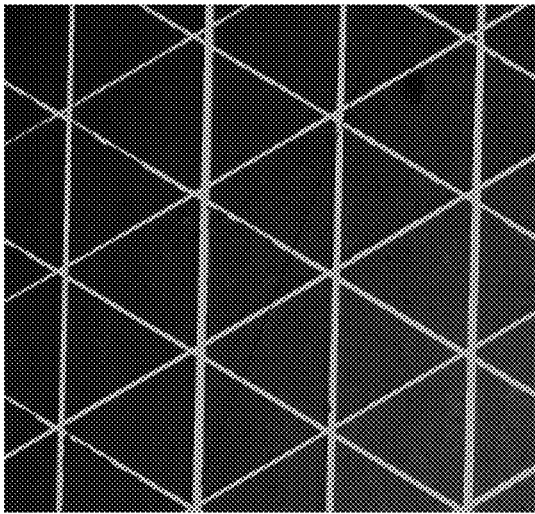
FIG. 2 shows an optical microscope photograph of the surface of the Ag triangular grid flexible transparent PET film of Example 2.

(4) Take out the PI/PET/glass plate combination, rotate the PI template clockwise by 60° and fix it on the PET surface, put it into the magnetron sputtering chamber again for sputtering, and the sputtering parameters are the same as above; Take out the PI/PET/glass plate combination, rotate the PI template clockwise by 60° again and fix it on the PET substrate, put it in the magnetron sputtering chamber and sputter again with the same sputtering parameters as above, and finally the flexible transparent conductive PET film coated with Ag triangular lattice was obtained, as shown in FIG. 2.

The thickness of the metal grid is about 150 nm, the light transmittance is 92.3% (at a wavelength of 550 nm), and the sheet resistance is 5.8 $\Omega sq^{-1}$.

Other Implementation Example

The other steps are the same as in Examples 1 or 2, where products with different line widths in the metal grid can be obtained only by changing the width of the hollow parallel stripe template, and/or change the spacing of the hollow parallel stripes to obtain products with different sizes and morphologies of squares and triangles. The sheet resistance and transmittance of the Ag grid PET films prepared in Examples 1-2 were tested using a four-point probes tester and UV-visible spectrometer, respectively.

Figure 3:
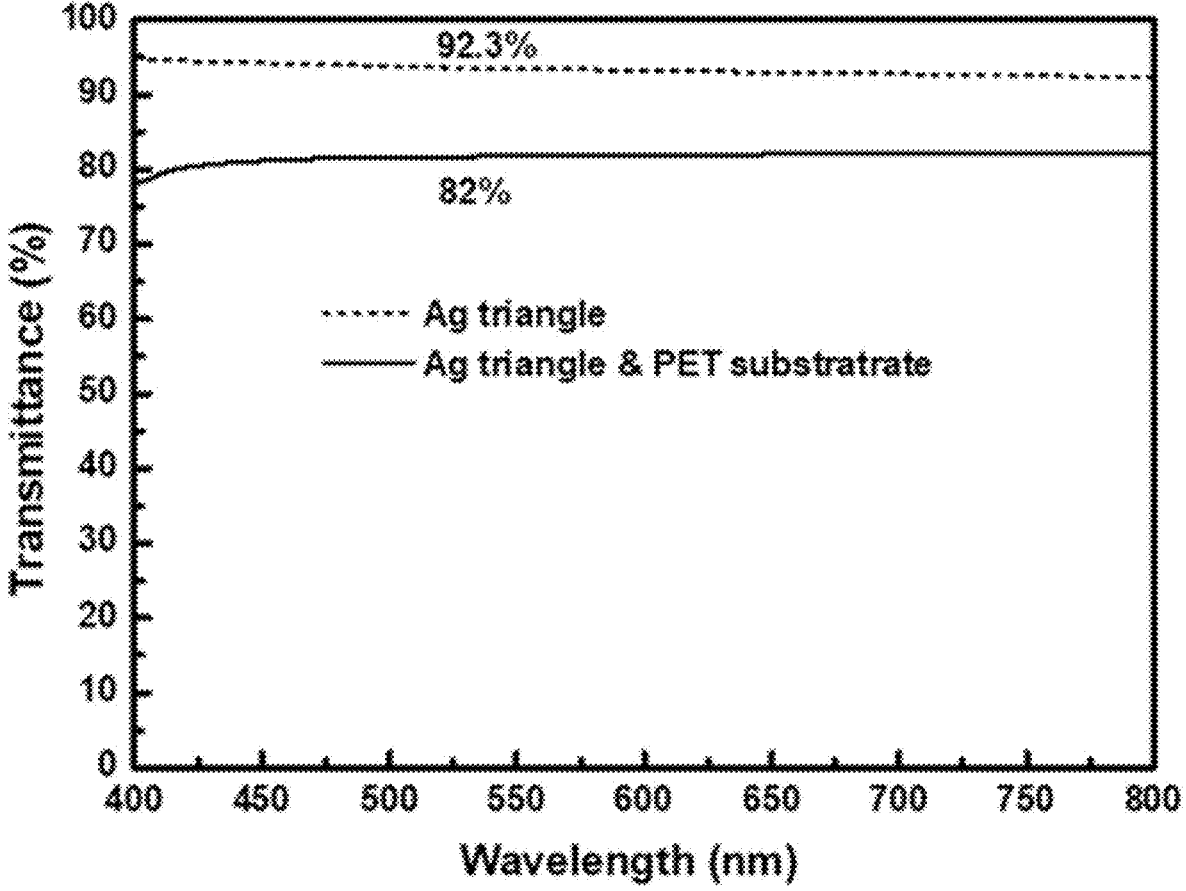
FIG. 3 shows a schematic diagram comparing the transmittance results of the Ag triangular grid flexible transparent PET film of Example 2.

As shown in FIG. 3, the light transmittance (at 550 nm) of the metal grid layer after deducting the flexible PET substrate in Examples 1-2 was tested to be able to reach 93.5%, and the overall transmittance (at 550 nm) of the Ag grid and flexible PET films reached more than 82%.

The sheet resistance of the Ag triangular grid flexible transparent PET film prepared in Example 2 was 5.806 $\Omega sq^{-1}$, and it can be seen that the sheet resistance of Examples 1-2 were all stabilized at 4 to 10 $\Omega sq^{-1}$.

Figure 4:
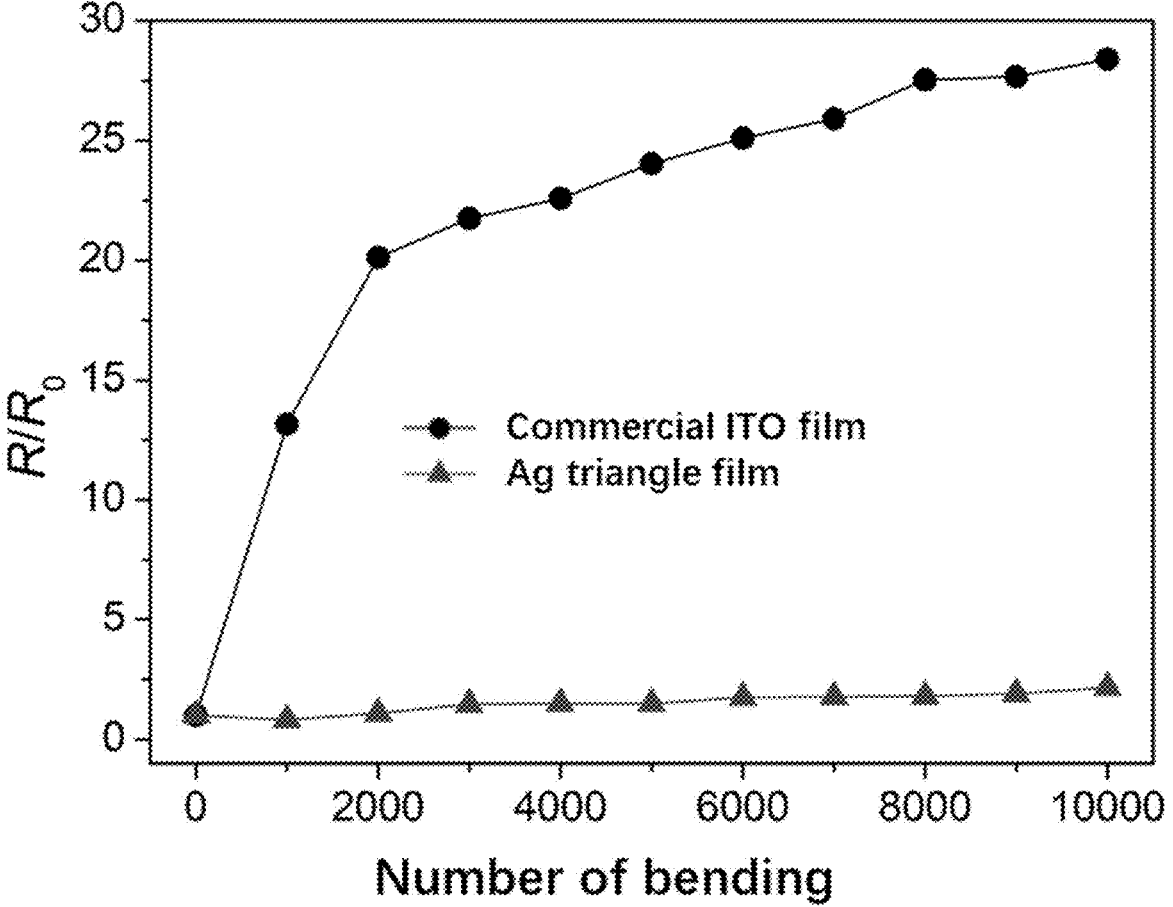
FIG. 4 shows a comparison of the conductivity loss test results between the Ag triangular grid flexible transparent PET film of Example 2 and a commercially flexible PET film coated with ITO after bending 10,000 times.

Bending resistance tests were performed on metal triangular grid transparent films to illustrate their fulfillment for subsequent mechanical applications in flexible devices. A bending machine (purchased from Barfan Technology Inc.) was used for the bending test, with a curvature radius of 5 $\mu mm$ and a concave bending loading mode to test the bending resistance of the metal triangular grid structure. After 10,000 times of bending, the relative sheet resistance changes of the flexible transparent conductive PET films with Ag triangular grids are <10%, and can be bent more than 100,000 times. FIG. 4 shows a comparison of electrical conductivity loss between the Ag triangular grid flexible transparent PET film of Example 2 and a commercially flexible PET film coated with ITO (purchased from South China Xiangcheng Technology Co., Ltd., with a product model number of "300*100*0.125 $\mu mm$ 6-8 ohm") after 10,000 times of bending. R is the sheet resistance and $R_0$ is the initial sheet resistance, as can be seen in FIG. 4, the Ag triangular grid flexible transparent PET film prepared in Example 2 has very good conductive stability after bending fatigue test.

The present disclosure utilizes magnetron sputtering to prepare a high-quality metal grid flexible and transparent conductive film composed of a flexible substrate (PET) and an Ag grid, which has high transmittance, high conductivity and strong bending fatigue resistance, and it is also possible to modulate the line width (1-50 $\mu m$) and the pattern (square, triangular, etc.) of the metal grid by designing and preparing templates, regulate the thickness of the metal grid (50-600 nm) by controlling the deposition time of the sputtered coating, thus optimizing the light transmittance and electrical conductivity of the film.

The present disclosure optimizes the performance of the film by preparing different grid patterns and regulating the thickness of the metal grid, and takes advantage of the highly tunable nature of its microstructure to achieve an optimal balance between optical and electrical properties, which can be used as a flexible and transparent electrode material with excellent properties to satisfy different applications, such as to meet the needs of flexible displays or flexible electronics.

The magnetron sputtering process of the present disclosure is simple, low-cost, highly efficient, safe and non-toxic, and is capable of preparing metal grids of various size areas (2 cm×2 cm-20 cm×20 cm) with good quality, and the pattern templates prepared by laser cutting can be reused, which is simple, efficient and low-cost.

The foregoing is only a preferred application embodiment of the present disclosure, and it should be noted that for a person skilled in the art, a number of improvements and embellishments can be made without departing from the technical principles of the present disclosure, and these improvements and embellishments should also be regarded as the scope of protection of the present invention.

The invention claimed is:

1. A metal grid flexible transparent conductive film, comprising a flexible substrate and a sputtered metal grid,
   wherein the metal grid is disposed on the flexible substrate;
   wherein the flexible substrate is selected from a flexible PET substrate, a CPI substrate, and a flexible ultra-thin glass; and
   the metal grid is a metal Ag grid,
   the metal grid flexible transparent conducive film is prepared by a method comprising:
   S1, preparing a polymer template, cutting a desired hollow parallel stripe pattern in the center of the polymer template;
   S2, taping a flexible substrate to a substrate to form a flexible substrate/baseboard assembly, and fixing the polymer template prepared in S1 to the flexible substrate to form a template/substrate/baseboard assembly;
   S3, placing the template/substrate/baseboard assembly into a magnetron sputtering coating device, passing a rare gas under vacuum conditions, adjusting the power, sputtering a metal target onto the flexible substrate by magnetron sputtering method for deposition, separating the template from the template/substrate/baseboard assembly to obtain the metal grid flexible and transparent conductive film;
   wherein:
   S1 further comprises adjusting cutting parameters of laser to obtain different polymer template patterns, the cutting parameters comprising cutting energy, cutting spacing and cutting length, the cutting energy is 8-20 W, the cutting spacing is 100-500 $\mu m$ and the cutting length is 2-20 cm;
   S3 further comprises placing the template facing the Ag target under a vacuum of $10^{-5}$-$10^{-9}$ torr, the magnetron sputtering gas Ar bombard the target at a sputtering power of 300-500 W for 90-600 s under a partial pressure of Ar of 60%-70%;
   the thickness of metal grid is 150 nm-600 nm;
   the line width of the metal grid is 1 $\mu m$-10 $\mu m$;
   the metal grid flexible transparent conductive film has a sheet resistance of 4-1002 $sq^{-1}$;
   a light transmittance rate of the metal grid at 550 nm reaches 90% or more; and
   an overall transmittance of the metal grid flexible transparent conductive film at 550 nm is more than 82%.

2. The metal grid flexible transparent conductive film according to claim 1,
   wherein the metal grid forms a metal square grid, a metal triangular grid, a metal brick wall shaped grid, a metal honeycomb grid, a metal circular grid pattern on the flexible substrate.

3. The metal grid flexible transparent conductive film according to claim 1, wherein
   the size area of the metal grid ranges from 2 cm×2 cm-20 cm×20 cm.

4. The metal grid flexible transparent conductive film according to claim 1, wherein the light transmittance rate of the metal grid at 550 nm is 92% or more.

5. The metal grid flexible transparent conductive film according to claim 1, wherein the laser is used S1 to cut a desired hollow parallel stripe pattern in the center of the polymer template.

6. The metal grid flexible transparent conductive film according to claim 1, wherein further comprises: cleaning the flexible substrate with acetone and ethanol with a volume ratio of 1:1, and then cleaned in deionized water, blowing dry with nitrogen, and fixing the polymer template on the flexible substrate with high-temperature tape.

7. The metal grid flexible transparent conductive film according to claim 1, wherein the polymer template is a polyimide sheet; the overall size of polymer template is 4×4 to 24×24 cm, the thickness is 30 to 90 μm.

8. The metal grid flexible transparent conductive film according to claim 1, wherein the metal target is at least one of Ag target, Cu target, Al target, Au target.

9. Application of the metal grid flexible transparent conductive film of claim 1 in a flexible display or flexible electronic device.

10. The metal grid flexible transparent conductive film according to claim 1, wherein the light transmittance rate of the metal grid at 550 nm reaches 93.5% or more.

11. The metal grid flexible transparent conductive film according to claim 1, wherein in S3, the deposition time is 90 s-300 s.

12. The metal grid flexible transparent conductive film according to claim 1, wherein the pattern of polymer template is a parallel hollow stripe pattern, and the conductive film with a square, triangular or crossed metal grid pattern is obtained by coating 2, 3 or 4 times in S3, respectively.

* * * * *